US008581318B1

(12) United States Patent
Chen et al.

(10) Patent No.: US 8,581,318 B1
(45) Date of Patent: Nov. 12, 2013

(54) ENHANCED NON-NOBLE ELECTRODE LAYERS FOR DRAM CAPACITOR CELL

(71) Applicant: Intermolecular, Inc., San Jose, CA (US)

(72) Inventors: Hanhong Chen, Milpitas, CA (US); Wim Deweerd, San Jose, CA (US); Edward L. Haywood, San Jose, CA (US); Sandra G. Malhotra, Fort Collins, CO (US); Hiroyuki Ode, Higashihiroshima (JP)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/737,209

(22) Filed: Jan. 9, 2013

Related U.S. Application Data

(63) Continuation of application No. 13/494,693, filed on Jun. 12, 2012.

(51) Int. Cl.
*H01L 27/108* (2006.01)
*H01L 29/94* (2006.01)

(52) U.S. Cl.
USPC .................................. 257/306; 257/296

(58) Field of Classification Search
USPC ................................. 257/296–306
See application file for complete search history.

(56) References Cited

U.S. PATENT DOCUMENTS

| 5,719,422 A * | 2/1998 | Burr et al. ...................... 257/336 |
| 2006/0089006 A1* | 4/2006 | Katoda .......................... 438/758 |
| 2012/0061799 A1* | 3/2012 | Hashim et al. ................ 257/532 |
| 2012/0070942 A1* | 3/2012 | Fedorovskaya et al. ...... 438/127 |
| 2012/0287553 A1* | 11/2012 | Ramani et al. .............. 361/301.4 |
| 2012/0309162 A1* | 12/2012 | Chen et al. ................... 438/396 |
| 2013/0052790 A1* | 2/2013 | Deweerd et al. ............. 438/396 |

FOREIGN PATENT DOCUMENTS

JP  2010092693 A  *  4/2010

OTHER PUBLICATIONS

F. Goutenoire, O. Isnard, E. Suard, O. Bohnke, Y. Laligant, R. Retoux, Ph. Lacorre, Structural and transport characteristics of the LAMOX family of fast oxide-ion conductors, based on lanthanum molybdenum oxide La2Mo2O9, 2001, J. Mater. Chem., 11, 119-124.*

* cited by examiner

*Primary Examiner* — Charles Garber
*Assistant Examiner* — Brigitte Paterson

(57) ABSTRACT

A metal oxide first electrode material for a MIM DRAM capacitor is formed wherein the first and/or second electrode materials or structures contain layers having one or more dopants up to a total doping concentration that will not prevent the electrode materials from crystallizing during a subsequent anneal step. Advantageously, the electrode doped with one or more of the dopants has a work function greater than about 5.0 eV. Advantageously, the electrode doped with one or more of the dopants has a resistivity less than about 1000 μΩcm. Advantageously, the electrode materials are conductive molybdenum oxide.

20 Claims, 10 Drawing Sheets

ENHANCED NON-NOBLE ELECTRODE LAYERS FOR DRAM CAPACITOR CELL

CROSS-REFERENCE TO RELATED APPLICATIONS

This is a Continuation Application of U.S. patent application Ser. No. 13/494,693, filed on Jun. 12, 2012, which is herein incorporated by reference for all purposes.

This document relates to the subject matter of a joint research agreement between Intermolecular, Inc. and Elpida Memory, Inc.

FIELD OF THE INVENTION

The present invention relates generally to the field of dynamic random access memory (DRAM), and more particularly to methods of forming a capacitor stack for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors cannot be reduced without limit in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. titanium nitride), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k-values greater than about 40. Such materials are generally classified as high-k materials. Representative examples of high-k materials for MIM capacitors are non-conducting metal oxides, non-conducting metal nitrides, non-conducting metal silicates or combinations thereof. These dielectric materials may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium oxide and zirconium oxide are two metal oxide dielectric materials which display significant promise in terms of serving as high-k dielectric materials for implementation in DRAM capacitors. Other metal oxide high-k dielectric materials that have attracted attention include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc.

The dielectric constant of a dielectric material may be dependent upon the crystalline phase(s) of the material. For example, in the case of titanium oxide (specifically TiO$_2$), the anatase crystalline phase of TiO$_2$ has a dielectric constant of approximately 40, while the rutile crystalline phase of TiO$_2$ can have a dielectric constant of approximately >80. Due to the higher-k value of the rutile-phase, it is desirable to produce TiO$_2$ based DRAM capacitors with the TiO$_2$ in the rutile-phase. The relative amounts of the anatase phase and the rutile phase can be determined from x-ray diffraction (XRD). From Eqn. 1 above, a TiO$_2$ material in the rutile-phase could be physically thicker and maintain the desired capacitance. The increased physical thickness is important for lowering the leakage current of the capacitor. The anatase phase will transition to the rutile phase at high temperatures (>8000). However, high temperature processes are undesirable in the manufacture of DRAM devices.

The crystal phase of an adjacent material can be used to influence the growth of a specific crystal phase of a material if their crystal structures are similar and their lattice constants are similar. This technique is well known in technologies such as epitaxial growth. The same concepts have been extended to the growth of thin films where the adjacent material can be used as a "template" to encourage the growth of a desired crystalline phase over other competing crystal phases.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric material within the DRAM capacitor. Metals, such as platinum, gold, ruthenium, and ruthenium oxide are examples of high work function electrode materials suitable for inhibiting device leakage in a DRAM capacitor having a high-k dielectric material. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C) processes may be applied to complete the device fabrication. During these subsequent process steps, the DRAM capacitor materials must remain chemically, physically, and structurally stable. They must maintain the structural, compositional, physical, and electrical properties that have been developed. Furthermore, they should not undergo significant interaction or reaction which may degrade the performance of the DRAM capacitor.

Conductive metal oxides, conductive metal silicides, conductive metal carbides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Conductive metal nitrides such as titanium nitride, tantalum nitride, tungsten nitride, etc. have attracted interest as DRAM capacitor electrodes with titanium nitride being the most popular. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ is conductive and has shown great promise as an electrode material in DRAM capacitors. $MoO_2$ has a distorted rutile crystal structure and can serve as an acceptable template to promote the deposition of the rutile-phase of titanium oxide as discussed above. $MoO_2$ also has a high work function (can be >5.0 eV depending on process history) which helps to minimize the leakage current of the DRAM device. However, oxygen-rich phases ($MoO_{2+x}$) of $MoO_2$ degrade the performance of the $MoO_2$ electrode material because they act more like insulators and have crystal structures that do not promote the formation of the rutile-phase of titanium oxide. For example, $MoO_3$ (the most oxygen-rich phase) is a dielectric material and has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in an inert or reducing atmosphere have been developed that allow crystalline $MoO_2$ to be used as the first electrode material (i.e. bottom electrode) in MIM DRAM capacitors with $TiO_2$ or doped-$TiO_2$ high-k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference. Other conductive metal oxides that may be used as a template for the rutile phase of $TiO_2$ include the conductive compounds of chromium oxide, cobalt oxide, iridium oxide, manganese oxide, nickel oxide, ruthenium oxide, tin oxide, or tungsten oxide.

The use of $MoO_2$ as a first electrode material has a number of additional issues. Although the work function can be around 5.0 eV, this is not high enough to minimize the leakage current to meet the specifications of some advanced devices. Additionally, the resistivity of $MoO_2$ is high (~1000 $\mu\Omega$cm). This impacts the speed and power usage of the device.

Therefore, there is a need to develop processes that allow the formation of a metal oxide first electrode material that can serve as a template for the rutile phase of $TiO_2$, that contributes to lower leakage current, and has low resistivity which contributes to higher device speed and lower power usage.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, a metal oxide first electrode material is formed as part of a MIM DRAM capacitor stack. The first electrode material is doped with one or more dopants. The dopants may influence the work function of the first electrode material may alter the resistivity of the first electrode material. The dopants may be uniformly distributed throughout the first electrode material or may be distributed with a gradient in their concentration profile. The doped first electrode material may contribute in lowering the leakage current of the capacitor stack.

In some embodiments of the present invention, a metal oxide second electrode material is formed as part of a MIM DRAM capacitor stack. The second electrode material is doped with one or more dopants. The dopants may influence the work function of the second electrode material may alter the resistivity of the second electrode material. The dopants may be uniformly distributed throughout the second electrode material or may be distributed with a gradient in their concentration profile. The doped second electrode material may contribute in lowering the leakage current of the capacitor stack.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

DRAM capacitor stacks are formed from a number of deposited thin films. Generally, a deposited thin film may be amorphous, crystalline, or a mixture thereof. Furthermore, several different crystalline phases may exist. Therefore, processes (both deposition and post-treatment) must be developed to maximize the formation of the desired composition and crystalline phase of the thin film. The thin films used to form the MIM DRAM capacitor stack may be formed using any common technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various materials discussed below. Those skilled in the art will appreciate that the teachings described below are not limited by the technology used for the deposition process.

In FIGS. 4-10 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 1:
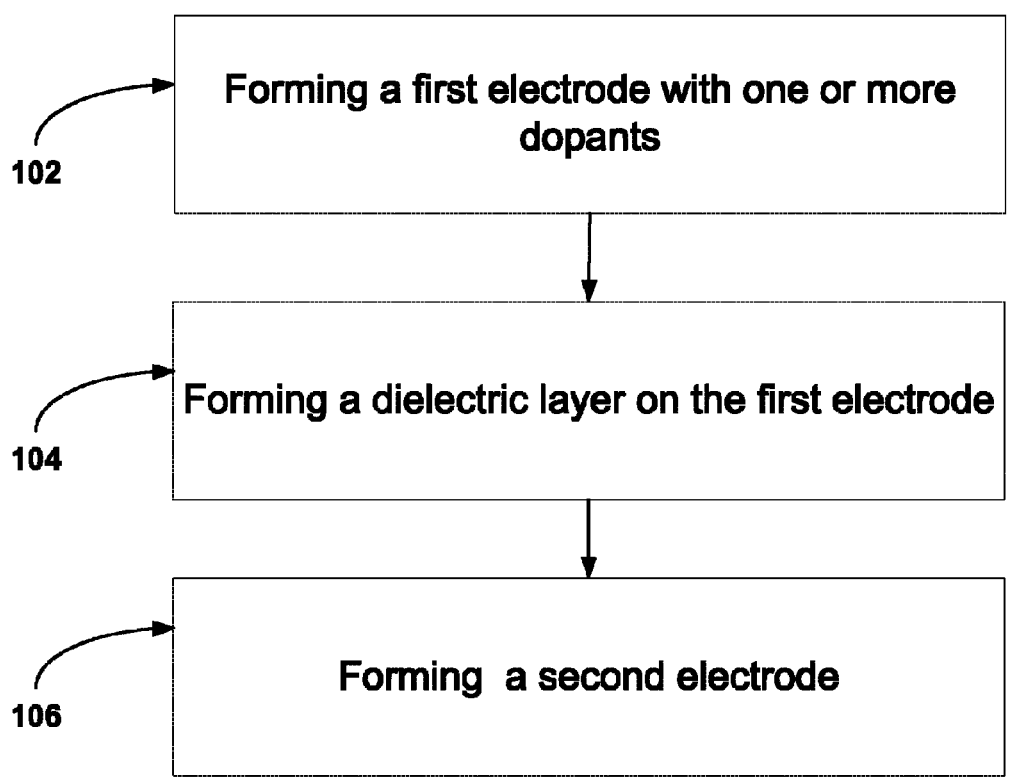
FIG. 1 illustrates a flow chart illustrating a method for fabricating a DRAM capacitor stack in accordance with some embodiments of the present invention.

FIG. 1 describes a method, 100, for fabricating a DRAM capacitor stack. The initial step, 102, comprises forming a first electrode material above a substrate, wherein the first electrode material comprises a metal element. Examples of suitable electrode materials comprise metals, conductive metal oxides, conductive metal silicides, conductive metal nitrides, and combinations thereof. A particularly interesting class of materials is the conductive metal oxides. The first electrode material is formed with one or more dopants added that alter the work function and/or the resistivity of the first electrode material. The dopants may be uniformly distributed throughout the first electrode material or may be distributed with a gradient in their concentration profile. The doped first electrode material may contribute in lowering the leakage current of the capacitor stack. In some embodiments, the first electrode material is formed from layers of different materials. As an example, the first electrode material may be formed from a metal or conductive metal nitride and a conductive metal oxide. The first electrode material can then be subjected to an annealing process (not shown). The next step, 104, comprises forming a dielectric material above the first electrode material. Optionally, the dielectric material can then be subjected to a post dielectric anneal (PDA) treatment (not shown). The PDA step serves to crystallize the dielectric material and fill oxygen vacancies. The next step, 106, comprises forming a second electrode material above the dielectric material, wherein the second electrode material comprises a metal element. Examples of suitable electrode materials comprise metals, conductive metal oxides, conductive metal silicides, conductive metal nitrides, and combinations thereof. Optionally, the capacitor stack can then be subjected to PMA treatment process (not shown). Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference.

In the embodiments wherein the dopants are distributed throughout the first electrode material with a gradient in their concentration profile, it may be advantageous to distribute the dopant such that the concentration of the dopant is lowest at the first electrode material/dielectric material interface. This distribution will decrease the amount of the dopant that may diffuse into the dielectric material during subsequent anneal steps. Some dopants may negatively impact the performance of the dielectric material (i.e. lower the k-value, increase the EOT performance, increase the leakage current, etc.).

Figure 2:
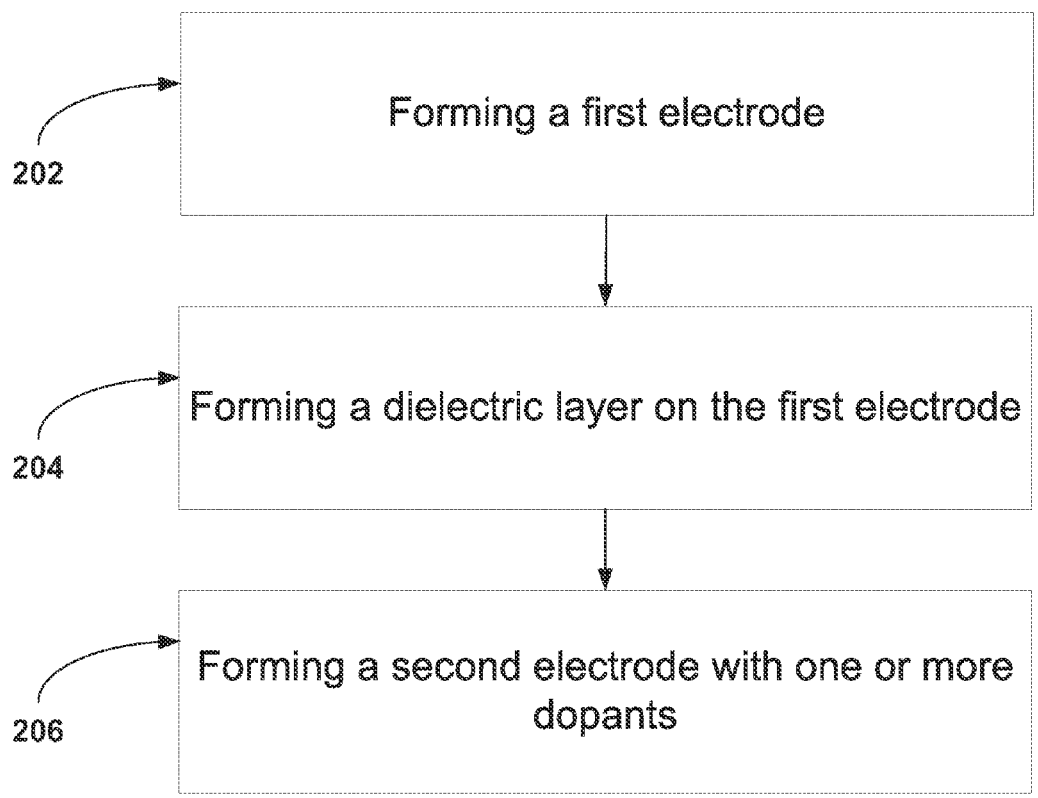
FIG. 2 illustrates a flow chart illustrating a method for fabricating a DRAM capacitor stack in accordance with some embodiments of the present invention.

FIG. 2 describes a method, 200, for fabricating a DRAM capacitor stack. The initial step, 202, comprises forming a first electrode material above a substrate, wherein the first electrode material comprises a metal element. The next step, 204, comprises forming a dielectric material above the first electrode material. Optionally, the dielectric material can then be subjected to a post dielectric anneal (PDA) treatment (not shown). The PDA step serves to crystallize the dielectric material and fill oxygen vacancies. The next step, 206, comprises forming a second electrode material above the dielectric material, wherein the second electrode material comprises a metal element. Examples of suitable second electrode materials comprise metals, conductive metal oxides, conductive metal silicides, conductive metal nitrides, and combinations thereof. A particularly interesting class of materials is the conductive metal oxides. The second electrode material is formed with one or more dopants added that alter the work function and/or the resistivity of the second electrode material. The dopants may be uniformly distributed throughout the second electrode material or may be distributed with a gradient in their concentration profile. The doped second electrode material may contribute in lowering the leakage current of the capacitor stack. In some embodiments, the second electrode material is formed from layers of different materials. As an example, the second electrode material may be formed from a metal or conductive metal nitride and a conductive metal oxide. Optionally, the capacitor stack can then be subjected to PMA treatment process (not shown).

In the embodiments wherein the dopants are distributed throughout the second electrode material with a gradient in their concentration profile, it may be advantageous to distribute the dopant such that the concentration of the dopant is lowest at the second electrode material/dielectric material interface. This distribution will decrease the amount of the dopant that may diffuse into the dielectric material during subsequent anneal steps. Some dopants may negatively impact the performance of the dielectric material (i.e. lower the k-value, increase the EOT performance, increase the leakage current, etc.).

Figure 3:
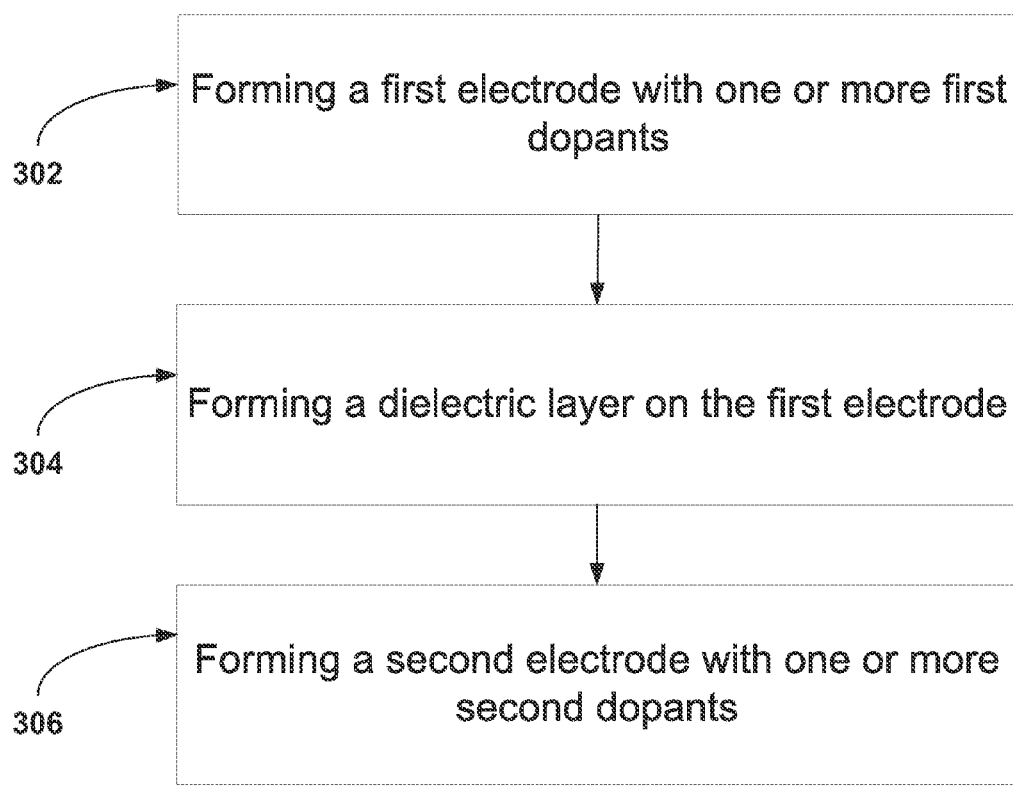
FIG. 3 illustrates a flow chart illustrating a method for fabricating a DRAM capacitor stack in accordance with some embodiments of the present invention.

FIG. 3 describes a method, 300, for fabricating a DRAM capacitor stack. The initial step, 302, comprises forming a first electrode material above a substrate, wherein the first electrode material comprises a metal element. Examples of suitable electrode materials comprise metals, conductive metal oxides, conductive metal silicides, conductive metal nitrides, and combinations thereof. A particularly interesting class of materials is the conductive metal oxides. The first electrode material is formed with one or more first dopants added that alter the work function and/or the resistivity of the first electrode material. The dopants may be uniformly distributed throughout the second electrode material or may be distributed with a gradient in their concentration profile as discussed previously. The doped first electrode material may contribute in lowering the leakage current of the capacitor stack. In some embodiments, the first electrode material is formed from layers of different materials. As an example, the first electrode material may be formed from a metal or conductive metal nitride and a conductive metal oxide. The first electrode material can then be subjected to an annealing process (not shown). The next step, 304, comprises forming a dielectric material above the first electrode material. Optionally, the dielectric material can then be subjected to a post dielectric anneal (PDA) treatment (not shown). The PDA step serves to crystallize the dielectric material and fill oxygen vacancies. The next step, 306, comprises forming a second electrode material above the dielectric material, wherein the second electrode material comprises a metal element. Examples of suitable second electrode materials comprise metals, conductive metal oxides, conductive metal silicides, conductive metal nitrides, and combinations thereof. A particularly interesting class of materials is the conductive metal oxides. The second electrode material is formed with one or more second dopants added that alter the work function and/or the resistivity of the second electrode material. The dopants may be uniformly distributed throughout the second electrode material or may be distributed with a gradient in their concentration profile as discussed previously. The first and second dopants may be the same or may be different materials. The doped second electrode material may contribute in lowering the leakage current of the capacitor stack. In some embodiments, the second electrode material is formed from layers of different materials. As an example, the second electrode material may be formed from a metal or conductive metal nitride and a conductive metal oxide. Optionally, the capacitor stack can then be subjected to PMA treatment process (not shown).

Figure 4A:
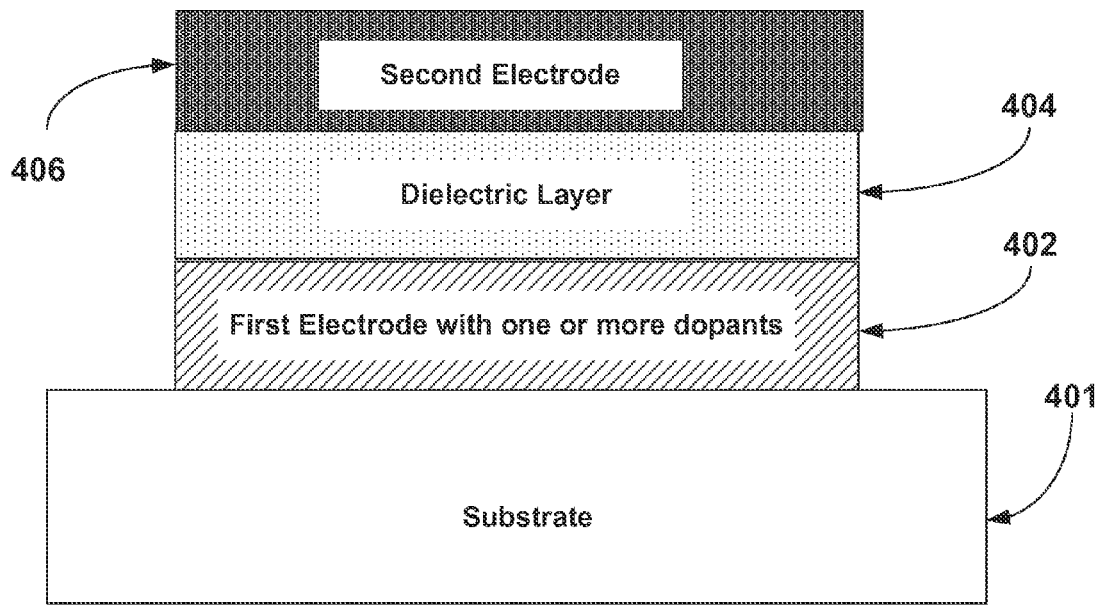
FIGS. 4A and 4B illustrate simplified cross-sectional views of a DRAM capacitor stack fabricated in accordance with some embodiments of the present invention.

FIG. 4A illustrates a simple capacitor stack, 400, consistent with some embodiments of the present invention. Using the method as outlined in FIG. 1 and described above, first electrode material, 402, is formed above substrate, 401. Generally, the substrate has already received several processing steps in the manufacture of a full DRAM device. First electrode material, 402, comprises one of metals, conductive metal oxides, conductive metal nitrides, conductive metal silicides, etc. In some embodiments of the present invention, the first electrode material is a conductive metal oxide. In FIG. 4A, first electrode material, 402, is illustrated as being formed from a single material. The first electrode is formed with one or more dopants added that alter the work function and/or the resistivity of the first electrode material. The dopants may be uniformly distributed throughout the first electrode material or may be distributed with a gradient in their concentration profile as discussed previously.

Dopants may be added to the first electrode material to alter properties such as the work function and the resistivity. The dopants may be added to the first electrode material by introducing the dopant species during the formation of the first electrode material. Typically, the first electrode materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the first electrode material or may be distributed with a gradient in their concentration profile. A second class of dopants may be added to the first electrode to alter the resistivity. The dopants may be metals, metal oxides, metal nitrides, metal silicides, metal carbides, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the first electrode material or may be distributed with a gradient in their concentration profile. The dopants will be added to a concentration that will not negatively impact the ability of the first electrode material to form the desired crystalline phase to serve as a template for the rutile phase of titanium oxide formed in a subsequent step. The maximum doping concentration will vary depending on the dopant material and subsequent anneal conditions. Generally, the doping concentration is chosen such that it does not prevent the first electrode from crystallizing during the subsequent anneal step. As used herein, the first electrode material will be considered to be crystallized if it is ≥30% crystalline after the anneal as determined by techniques such as x-ray diffraction (XRD). The first electrode material, 402, can be annealed to crystallize the material. The doped first electrode material may contribute in lowering the leakage current of the capacitor stack.

In the next step, dielectric material, 404, would then be formed above the first electrode material, 402. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments of the present invention, the dielectric material is titanium oxide. Typically, dielectric material, 404, is subjected to a PDA treatment before the formation of the second electrode material as mentioned earlier.

In the next step, the second electrode material, 406, is formed above dielectric material, 404. The second electrode material comprises one of metals, conductive metal oxides, conductive metal nitrides, conductive metal silicides, conductive metal carbides, etc. Typically, the capacitor stack would then be subjected to a PMA treatment.

Figure 4B:
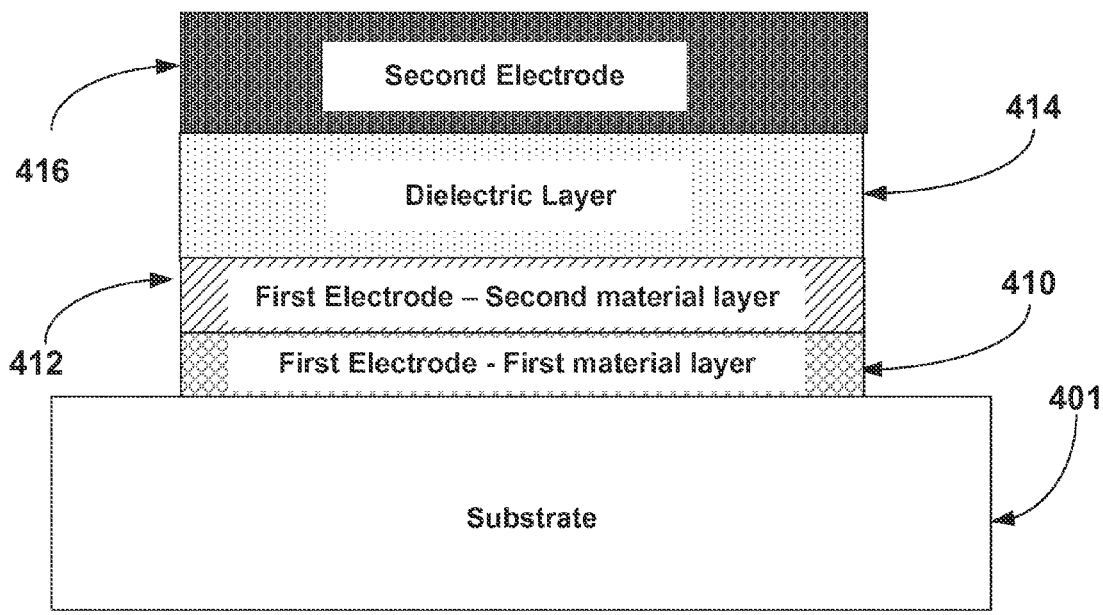

FIG. 4B illustrates a simple capacitor stack, 408, consistent with some embodiments of the present invention. Using the method as outlined in FIG. 1 and described above, the first electrode structure is comprised of multiple layers of material. First material layer, 410, is formed above substrate, 401. Generally, the substrate has already received several processing steps in the manufacture of a full DRAM device. First material layer, 410, comprises one of metals, conductive metal oxides, conductive metal nitrides, conductive metal silicides, etc. Optionally, the first material layer, 410, and be doped as discussed below. The purpose of this layer is to provide high conductivity to the first electrode material. In some embodiments of the present invention, the first material is a metal or a conductive metal nitride. Second material layer, 412, is formed above the first material layer, 410. Second material layer, 410, comprises one of metals, conductive metal oxides, conductive metal nitrides, conductive metal silicides, etc. The second material layer is formed with one or more dopants added that alter the work function and/or the resistivity of the second material layer. The dopants may be uniformly distributed throughout the second material layer or may be distributed with a gradient in their concentration profile as discussed previously.

Dopants may be added to the second material layer to alter properties such as the work function and the resistivity. The dopants may be added to the second material layer by introducing the dopant species during the formation of the second material layer. Typically, both of the first electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the first electrode structure materials or may be distributed with a gradient in their concentration profile. The dopants may be added at a concentration that will not negatively impact the ability of the first electrode structure materials to form the desired crystalline phase to serve as a template for the rutile phase of titanium oxide formed in a subsequent step. The maximum doping concentration will vary depending on the dopant material and subsequent anneal conditions. Generally, the doping concentration is chosen such that it does not prevent the first electrode structure materials from crystallizing during the subsequent anneal step. As used herein, the first electrode structure materials will be considered to be crystallized if they are ≥30% crystalline after the anneal as determined by techniques such as x-ray diffraction (XRD). The first electrode structure materials, 410 and 412, can be annealed to crystallize the materials. The doped second electrode material may contribute in lowering the leakage current of the capacitor stack.

In the next step, dielectric material, 414, would then be formed above the first electrode structure, 410 and 412. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments of the present invention, the dielectric material is titanium oxide. Typically, dielectric material, 414, is subjected to a PDA treatment before the formation of the second electrode material as discussed earlier.

In the next step, the second electrode material, 416, is formed above dielectric material, 414. The second electrode material comprises one of metals, conductive metal oxides, conductive metal nitrides, conductive metal silicides, conductive metal carbides, etc. Typically, the capacitor stack would then be subjected to a PMA treatment.

Figure 5A:
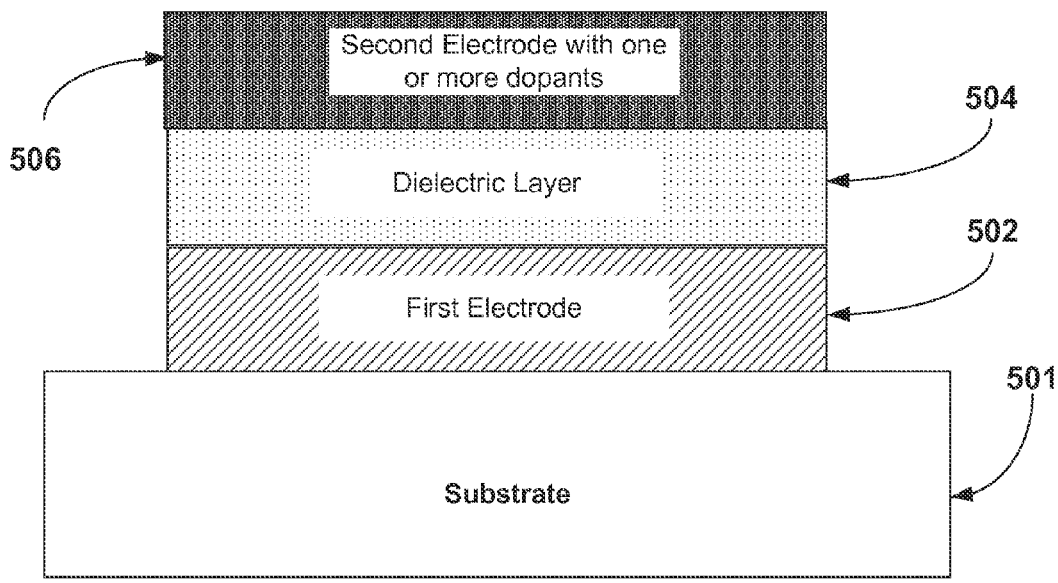
FIGS. 5A and 5B illustrate simplified cross-sectional views of a DRAM capacitor stack fabricated in accordance with some embodiments of the present invention.

FIG. 5A illustrates a simple capacitor stack, 500, consistent with some embodiments of the present invention. Using the method as outlined in FIG. 2 and described above, first electrode material, 502, is formed above substrate, 501. Generally, the substrate has already received several processing steps in the manufacture of a full DRAM device. First electrode material, 502, comprises one of metals, conductive metal oxides, conductive metal nitrides, conductive metal silicides, etc. In some embodiments of the present invention, the first electrode material is a conductive metal oxide. The first electrode material, 502, can be annealed to crystallize the material.

In the next step, dielectric material, 504, would then be formed above the first electrode material, 502. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments of the present invention, the dielectric material is titanium oxide. Typically, dielectric material, 504, is subjected to a PDA treatment before the formation of the second electrode material as mentioned earlier.

In the next step, the second electrode material, 506, is formed above dielectric material, 504. The second electrode material comprises one of metals, conductive metal oxides, conductive metal nitrides, conductive metal silicides, conductive metal carbides, etc. The second electrode material is formed with one or more dopants added that alter the work function and/or the resistivity of the second electrode material. The dopants may be uniformly distributed throughout the second electrode material or may be distributed with a gradient in their concentration profile.

Dopants may be added to the second electrode material to alter properties such as the work function and the resistivity. The dopants may be added to the second electrode material by introducing the dopant species during the formation of the second electrode material. Typically, the second electrode materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode material or may be distributed with a gradient in their concentration profile. A second class of dopants may be added to the second electrode material to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode material or may be distributed with a gradient in their concentration profile. The maximum doping concentration will vary depending on the dopant material and subsequent anneal conditions. Generally, the doping concentration is chosen such that it does not prevent the second electrode material from crystallizing during the subsequent anneal step. As used herein, the second electrode material will be considered to be crystallized if it is ≥30% crystalline after the anneal as determined by techniques such as x-ray diffraction (XRD). Typically, the capacitor stack would then be subjected to a PMA treatment. The doped second electrode material may contribute in lowering the leakage current of the capacitor stack.

Figure 5B:
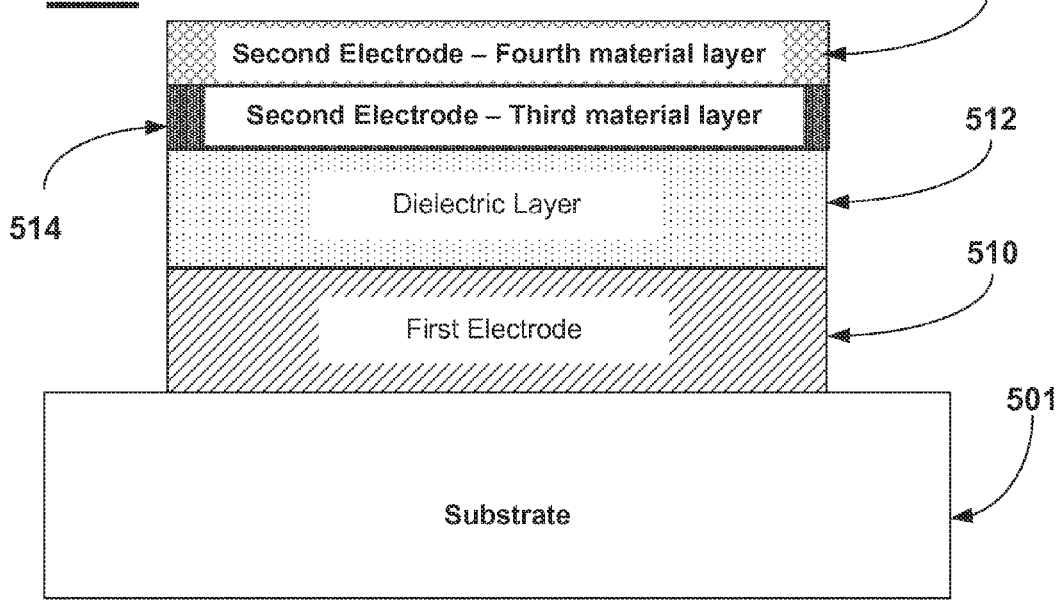

FIG. 5B illustrates a simple capacitor stack, 508, consistent with some embodiments of the present invention. Using the method as outlined in FIG. 2 and described above, first electrode material, 510, is formed above substrate, 501. Generally, the substrate has already received several processing steps in the manufacture of a full DRAM device. First electrode material, 510, comprises one of metals, conductive metal oxides, conductive metal nitrides, conductive metal silicides, etc. In some embodiments of the present invention, the first electrode material is a conductive metal oxide. The first electrode material, 510, can be annealed to crystallize the material.

In the next step, dielectric material, 512, would then be formed above the first electrode material, 510. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments of the present invention, the dielectric material is titanium oxide. Typically, dielectric material, 512, is subjected to a PDA treatment before the formation of the second electrode material as mentioned earlier.

In the next step, the second electrode structure is comprised of multiple layers of material. The third material layer, 514, is formed above dielectric material, 512. The third material layer comprises one of metals, conductive metal oxides, conductive metal nitrides, conductive metal silicides, conductive metal carbides, etc. The third material layer additionally comprises one or more dopants added that alter the work function and/or the resistivity of the third material layer. The dopants may be uniformly distributed throughout the third material layer or may be distributed with a gradient in their concentration profile. Fourth material layer, 516, is formed above third material layer, 514, and comprises one of metals, conductive metal oxides, conductive metal nitrides, conductive metal silicides, etc. Optionally, the fourth material layer, 516, can be doped as discussed below. The purpose of this layer is to provide high conductivity to the second electrode structure. In some embodiments of the present invention, the fourth material layer is a metal or a conductive metal nitride.

Dopants may be added to the second electrode structure materials to alter properties such as the work function and the resistivity. The dopants may be added to the second electrode structure materials by introducing the dopant species during the formation of the second electrode structure materials. Typically, the second electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. A second class of dopants may be added to the second electrode material to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. The maximum doping concentration will vary depending on the dopant material and subsequent anneal conditions. Generally, the doping concentration is chosen such that it does not prevent the second electrode structure materials from crystallizing during the subsequent anneal step. As used herein, the second electrode structure materials will be considered to be crystallized if they are ≥30% crystalline after the anneal as determined by techniques such as x-ray diffraction (XRD). Typically, the capacitor stack would then be subjected to a PMA treatment. The doped second electrode structure may contribute in lowering the leakage current of the capacitor stack.

Figure 6A:
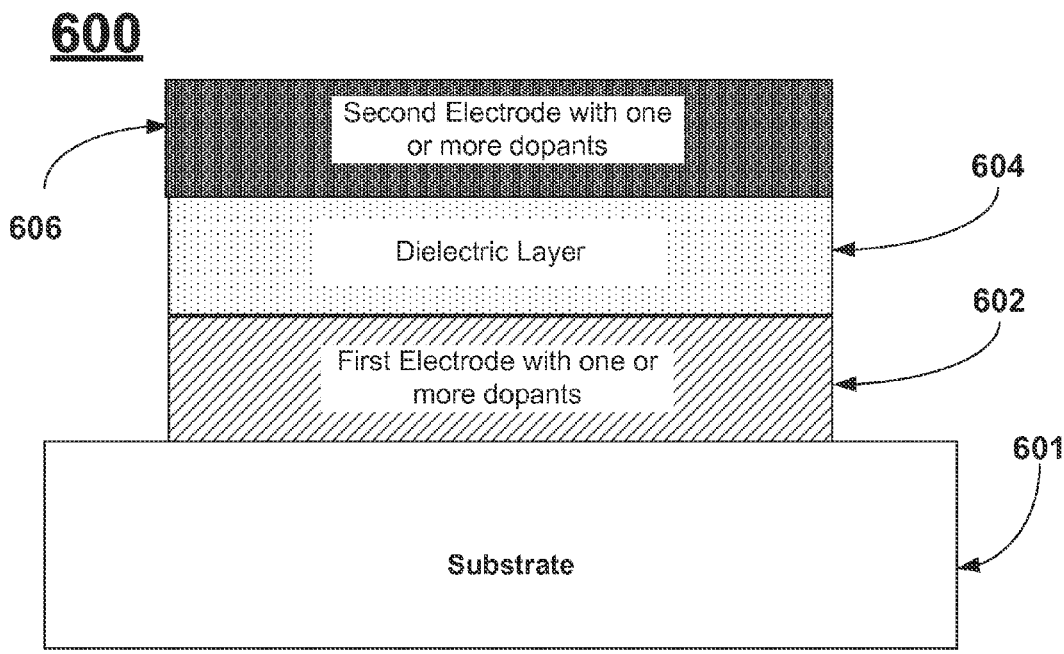
FIGS. 6A and 6B illustrate simplified cross-sectional views of a DRAM capacitor stack fabricated in accordance with some embodiments of the present invention.

FIG. 6A illustrates a simple capacitor stack, 600, consistent with some embodiments of the present invention. Using the method as outlined in FIG. 3 and described above, first electrode material, 602, is formed above substrate, 601. Generally, the substrate has already received several processing steps in the manufacture of a full DRAM device. First electrode material, 602, comprises one of metals, conductive metal oxides, conductive metal nitrides, conductive metal silicides, etc. In some embodiments of the present invention, the first electrode material is a conductive metal oxide. The first electrode material is formed with one or more first dopants added that alter the work function and/or the resistivity of the first electrode as described previously. The dopants may be uniformly distributed throughout the first electrode material or may be distributed with a gradient in their concentration profile. The first electrode material, 602, can be annealed to crystallize the material. The doped first electrode material may contribute in lowering the leakage current of the capacitor stack.

In the next step, dielectric material, 604, would then be formed above the first electrode material, 602. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments of the present invention, the dielectric material is titanium oxide. Typically, dielectric material, 604, is subjected to a PDA treatment before the formation of the second electrode material as mentioned earlier.

In the next step, the second electrode material, 606, is formed above dielectric material, 604. The second electrode material comprises one of metals, conductive metal oxides, conductive metal nitrides, conductive metal silicides, conductive metal carbides, etc. The second electrode material is formed with one or more second dopants added that alter the work function and/or the resistivity of the second electrode material as described previously. The dopants may be uniformly distributed throughout the second electrode material or may be distributed with a gradient in their concentration profile. The first and second dopants may be the same or may be different materials. Typically, the capacitor stack would then be subjected to a PMA treatment. The doped second electrode material may contribute in lowering the leakage current of the capacitor stack.

Figure 6B:
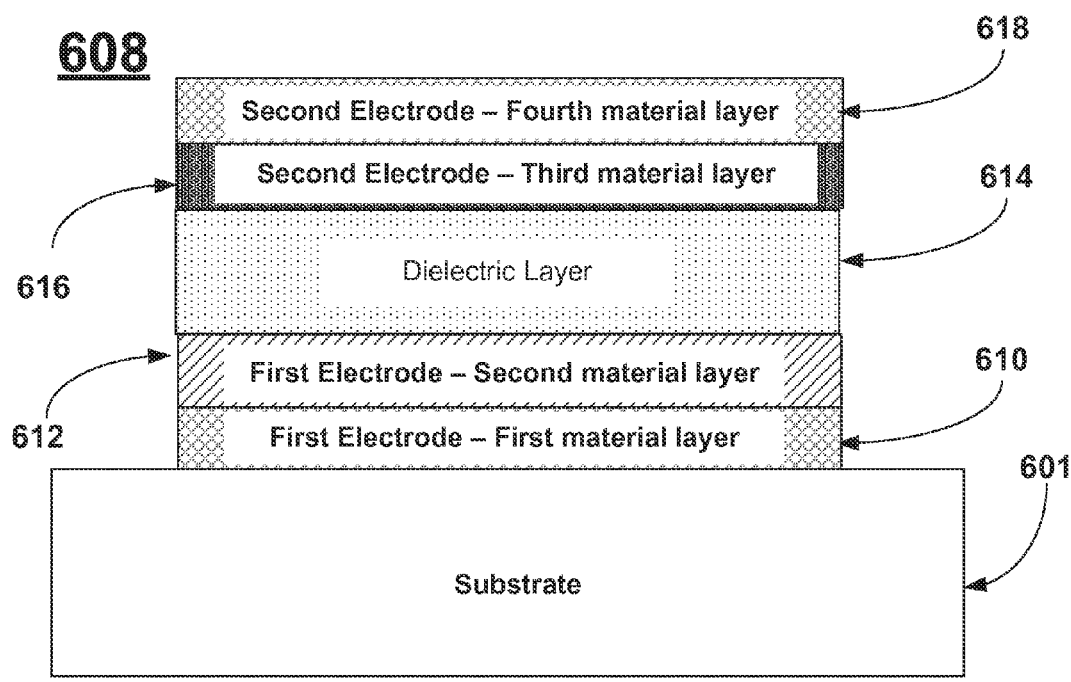

FIG. 6B illustrates a simple capacitor stack, 608, consistent with some embodiments of the present invention. Using the method as outlined in FIG. 3 and described above, the first electrode structure is comprised of multiple layers of material. First material layer, 610, is formed above substrate, 601. Generally, the substrate has already received several processing steps in the manufacture of a full DRAM device. First material layer, 610, comprises one of metals, conductive metal oxides, conductive metal nitrides, conductive metal silicides, etc. Optionally, the first material layer, 610, can be doped as discussed below. The purpose of this layer is to provide high conductivity to the first electrode structure. In some embodiments of the present invention, the first material is a metal or a conductive metal nitride. Second material layer, 612, is formed above the first material layer, 610. Second material layer, 610, comprises one of metals, conductive metal oxides, conductive metal nitrides, conductive metal silicides, etc. The second material layer is formed with one or more dopants added that alter the work function and/or the resistivity of the second material layer. The dopants may be uniformly distributed throughout the second material layer or may be distributed with a gradient in their concentration profile as discussed previously.

Dopants may be added to the second material layer to alter properties such as the work function and the resistivity. The dopants may be added to the second material layer by introducing the dopant species during the formation of the second material layer. Typically, both of the first electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the first electrode structure materials or may be distributed with a gradient in their concentration profile. The dopants may be added at a concentration that will not negatively impact the ability of the first electrode structure materials to form the desired crystalline phase to serve as a template for the rutile phase of titanium oxide formed in a subsequent step. The maximum doping concentration will vary depending on the dopant material and subsequent anneal conditions. Generally, the doping concentration is chosen such that it does not prevent the first electrode structure materials from crystallizing during the subsequent anneal step. As used herein, the first electrode structure materials will be considered to be crystallized if they are ≥30% crystalline after the anneal as determined by techniques such as x-ray diffraction (XRD). The first electrode structure materials, 610 and 612, can be annealed to crystallize the material. The doped first and/or second electrode materials may contribute in lowering the leakage current of the capacitor stack.

In the next step, dielectric material, 614, would then be formed above the first electrode structure, 610 and 612. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments of the present invention, the dielectric material is titanium oxide. Typically, dielectric material, 614, is subjected to a PDA treatment before the formation of the second electrode material as mentioned earlier.

In the next step, the second electrode structure is comprised of multiple layers of material. The third material layer, 616, is formed above dielectric material, 614. The third material layer comprises one of metals, conductive metal oxides, conductive metal nitrides, conductive metal silicides, conductive metal carbides, etc. The third material layer additionally comprises one or more dopants added that alter the work function and/or the resistivity of the third material layer. The dopants may be uniformly distributed throughout the third material layer or may be distributed with a gradient in their concentration profile. Fourth material layer, 618, is formed above third material layer, 616, and comprises one of metals, conductive metal oxides, conductive metal nitrides, conductive metal silicides, etc. Optionally, the fourth material layer, 618, can be doped as discussed below. The purpose of this layer is to provide high conductivity to the second electrode structure. In some embodiments of the present invention, the fourth material layer is a metal or a conductive metal nitride.

Dopants may be added to the second electrode structure materials to alter properties such as the work function and the resistivity. The dopants may be added to the second electrode structure materials by introducing the dopant species during the formation of the second electrode structure materials. Typically, the second electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. A second class of dopants may be added to the second electrode material to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. The maximum doping concentration will vary depending on the dopant material and subsequent anneal conditions. Generally, the doping concentration is chosen such that it does not prevent the second electrode structure materials from crystallizing during the subsequent anneal step. As used herein, the second electrode structure materials will be considered to be crystallized if they are ≥30% crystalline after the anneal as determined by techniques such as x-ray diffraction (XRD). Typically, the capacitor stack would then be subjected to a PMA treatment. The doped second electrode structure may contribute in lowering the leakage current of the capacitor stack.

Figure 7A:
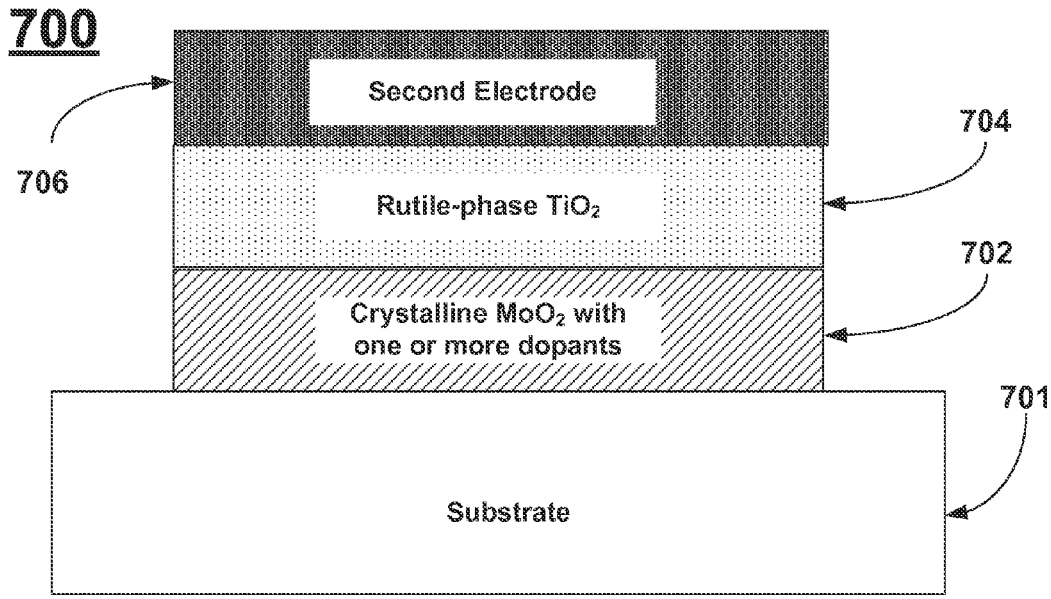
FIGS. 7A and 7B illustrate simplified cross-sectional views of a DRAM capacitor stack fabricated in accordance with some embodiments of the present invention.

FIG. 7A illustrates a simple capacitor stack, 700, consistent with some embodiments of the present invention. Using the method as outlined in FIG. 1 and described above, first electrode material, 702, is formed above substrate, 701. Generally, the substrate has already received several processing steps in the manufacture of a full DRAM device. First electrode material, 702, comprises one of metals, conductive metal oxides, conductive metal nitrides, conductive metal silicides, conductive metal carbides, etc. For this example, first electrode material, 702, comprises a conductive metal oxide that may serve to promote the rutile phase of titanium oxide. Examples of such conductive metal oxides include the conductive compounds of chromium oxide, cobalt oxide, iridium oxide, manganese oxide, molybdenum oxide nickel oxide, ruthenium oxide, tin oxide, or tungsten oxide. Specific electrode materials of interest are the conductive metal compounds of molybdenum oxide, tungsten oxide, tin oxide, and cobalt oxide. More specifically, in some embodiments, first electrode material, 702, comprises conductive metal compounds of molybdenum oxide.

Dopants may be added to the first electrode material to alter properties such as the work function and the resistivity. The dopants may be added to the first electrode material by introducing the dopant species during the formation of the first electrode material. Typically, the first electrode materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the first electrode material or may be distributed with a gradient in their concentration profile. A second class of dopants may be added to the first electrode material to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the first electrode material or may be distributed with a gradient in their concentration profile. The dopants will be added to a concentration that will not negatively impact the ability of the first electrode material to form the desired crystalline phase to serve as a template for the rutile phase of titanium oxide formed in a subsequent step. The maximum doping concentration will vary depending on the dopant material and subsequent anneal conditions. Generally, the doping concentration is chosen such that it does not prevent the first electrode material from crystallizing during the subsequent anneal step. As used herein, the first electrode material will be considered to be crystallized if it is ≥30% crystalline after the anneal as determined by technique such as x-ray diffraction (XRD). The doped first electrode material may contribute in lowering the leakage current of the capacitor stack.

As discussed previously, transition metals such as molybdenum can exist in a number of valence states. As an example, the molybdenum in $MoO_2$ is in the +4 valence state and the molybdenum in $MoO_3$ is in the +6 valence state. For very thin molybdenum oxide films (i.e. <about 10 nm), it is difficult to precisely control the Mo:O atomic ratio. This leads to a higher resistance material which may not meet the resistivity and device speed requirements for future DRAM devices. It is possible to add one or more dopants to the molybdenum oxide to alter the resistivity. Some materials that are attractive as dopants for molybdenum oxide comprise penta-valence elements that exist in a +5 valence state from Group-5 and Group-15 of the periodic table (using the new IUPAC designations). Specifically, elements such as antimony, arsenic, bismuth, niobium, phosphorous, tantalum, vanadium, or combinations thereof. Although not a penta-valence element, nitrogen (i.e. a Group-5 element) is also a potential dopant. Additionally, although not a penta-valence element, aluminum (i.e. a Group-13 element) is also a potential dopant. These elements will act as donors by substituting for the Mo4+ in the molybdenum oxide lattice and also contribute a free electron. These free electrons can improve the conductivity of the molybdenum oxide.

An analogy can be drawn between the doped molybdenum oxide system described herein and an illustrative system comprising doped tin oxide. Similar to molybdenum oxide, tin oxide exists in a rutile crystal structure and the tin atoms are in the +4 valence state. Undoped tin oxide has a resistivity of about $2 \times 10^{-2}$ Ω·cm while tin oxide doped with about 5 atomic % tantalum has a resistivity of about $1.1 \times 10^{-4}$ Ω·cm. Dopants are used to alter the resistivity of transparent conductive oxide (TCO) materials based on tin oxide.

A second class of dopants for molybdenum oxide comprises the halogens (i.e. Group-17 elements), and specifically fluorine and chlorine. These elements substitute for the $O^{2-}$ anions in the molybdenum oxide lattice and again, increase the number of free carriers. A similar analogy can be drawn as before in that halogen-doped TCO materials are known to have low resistivity values. As an example, tin oxide doped with fluorine can have a resistivity of about $5 \times 10^{-4}$ Ω·cm.

As discussed previously, other possible dopants for molybdenum oxide comprise nitrogen, phosphorous, and arsenic, although the mechanism for conductivity improvement is likely different. It is believed that they also substitute for the $O^{2-}$ anions in the lattice.

Optionally, first electrode material, 702, can be annealed to crystallize the material. In the case of crystalline molybdenum oxide, it is advantageous to anneal the first electrode material in an inert or reducing atmosphere to prevent the formation of oxygen-rich compounds as discussed earlier.

In one example of the present invention, a first electrode material comprising between about 3 nm and about 15 nm of molybdenum oxide is formed above a substrate. The molybdenum oxide electrode material is formed at a process temperature between about 125 C and about 400 C using an ALD process technology. One or more dopants are added to the molybdenum oxide which alter the work function and/or the resistivity. Examples of suitable dopants comprise aluminum, antimony, arsenic, bismuth, niobium, nitrogen, phosphorous, tantalum, vanadium, chlorine, fluorine or combinations thereof. In one example, the molybdenum oxide is formed at a thickness of about 17 nm and is doped with about 1 angstrom (1 ALD cycle) of aluminum. Optionally, the substrate with the first electrode material is then annealed in an inert or reducing atmosphere comprising between about 1% and about 10% $H_2$ in $N_2$ or other inert gases and advantageously between about 5% and about 10% $H_2$ in $N_2$ or other inert gases between about 300 C and about 650 C for between about 1 millisecond and about 60 minutes.

In the next step, dielectric material, 704, would then be formed above the annealed first electrode material, 702. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. Typically, dielectric material, 704, is subjected to a PDA treatment before the formation of the second electrode as discussed previously. A specific dielectric material of interest is titanium oxide doped with aluminum to between about 5 atomic % and about 15 atomic % aluminum. The rutile phase of titanium oxide will form preferentially on the underlying doped molybdenum oxide electrode resulting in a higher k value.

In a specific example, the dielectric material comprises between about 6 nm to about 10 nm of titanium oxide wherein at least 30% of the titanium oxide is present in the rutile phase after an anneal treatment. Generally, the titanium oxide dielectric material may either be a single film or may comprise a nanolaminate. Advantageously, the titanium oxide material is doped with aluminum at a concentration between about 5 atomic % and about 15 atomic % aluminum. The titanium oxide dielectric material is formed at a process temperature between about 200 C and 350 C using an ALD process technology. The substrate with the first electrode material and dielectric material is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 300 C to about 650 C for between about 1 millisecond to about 60 minutes.

Second electrode material, 706, is then formed above dielectric material, 704. The second electrode is typically a metal such as ruthenium, platinum, titanium nitride, tantalum nitride, titanium-aluminum-nitride, tungsten, tungsten nitride, molybdenum, molybdenum oxide, molybdenum nitride, vanadium nitride, or others. Advantageously, the second electrode material is molybdenum oxide. The second electrode material is typically between about 3 nm and 50 nm in thickness. As discussed previously, the second electrode material may also be doped with one or more dopants to alter the work function and/or the resistivity of the second electrode material as described previously. Typically, the capacitor stack is then subjected to a post metallization anneal (PMA) treatment. The PMA treatment serves to crystallize the second electrode material and to anneal defects and interface states that are formed at the dielectric/second electrode interface during the deposition. The doped second electrode material may contribute in lowering the leakage current of the capacitor stack.

Figure 7B:
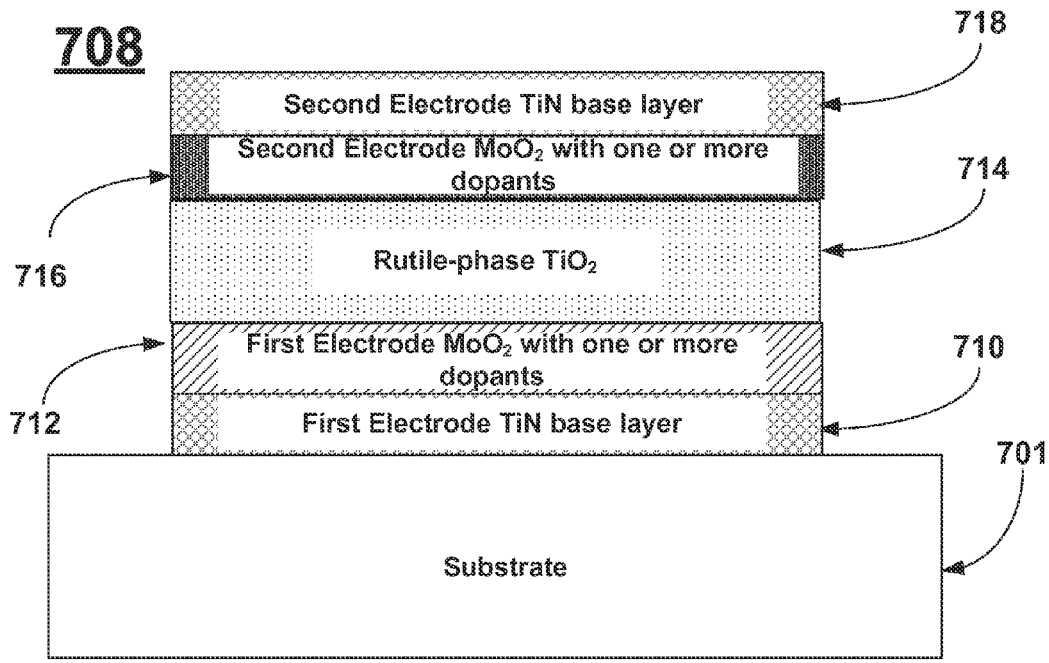

FIG. 7B illustrates a simple capacitor stack, 708, consistent with some embodiments of the present invention. Using the method as outlined in FIG. 3 and described above, the first electrode structure is comprised of multiple layers of material. First material layer, 710, is formed above substrate, 701. Generally, the substrate has already received several processing steps in the manufacture of a full DRAM device. First material layer, 710, comprises one of metals, conductive metal oxides, conductive metal nitrides, conductive metal silicides, etc. In one example, first material layer, 710, comprises titanium nitride. Optionally, the first material layer, 710, can be doped as discussed below. The purpose of this layer is to provide high conductivity to the first electrode structure. In some embodiments of the present invention, the first material is a metal or a conductive metal nitride. Second material layer, 712, is formed above the first material layer, 710. Second material layer, 712, comprises one of metals, conductive metal oxides, conductive metal nitrides, conductive metal silicides, etc. Advantageously, the second material layer comprises conductive molybdenum oxide. The second material layer is formed with one or more dopants added that alter the work function and/or the resistivity of the second material layer. The dopants may be uniformly distributed throughout the second material layer or may be distributed with a gradient in their concentration profile as discussed previously. In some embodiments, one of the dopants added to the second electrode material is aluminum.

Dopants may be added to the second material layer to alter properties such as the work function and the resistivity. The dopants may be added to the second material layer by introducing the dopant species during the formation of the second material layer. Typically, both of the first electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the first electrode structure materials or may be distributed with a gradient in their concentration profile. The dopants may be added at a concentration that will not negatively impact the ability of the first electrode structure materials to form the desired crystalline phase to serve as a template for the rutile phase of titanium oxide formed in a subsequent step. The maximum doping concentration will vary depending on the dopant material and subsequent anneal conditions. Generally, the doping concentration is chosen such that it does not prevent the first electrode structure materials from crystallizing during the subsequent anneal step. As used herein, the first electrode structure materials will be considered to be crystallized if they are ≥30% crystalline after the anneal as determined by techniques such as x-ray diffraction (XRD). The first electrode structure materials, 710 and 712, can be annealed to crystallize the material. The doped first and/or second electrode material may contribute in lowering the leakage current of the capacitor stack.

In one example of the present invention, a second electrode material comprising between about 5 nm and about 20 nm of molybdenum oxide is formed above a first electrode material comprising about 50 nm of titanium nitride to form the first electrode structure. These thicknesses are used as examples. Future DRAM devices will require molybdenum oxide thickness of about 2 nm to 3 nm and titanium nitride thicknesses of about 2 nm to 3 nm. The total thickness of the first electrode structure for future DRAM devices will be about 6 nm. The molybdenum oxide electrode material is formed at a process temperature between about 125 C and about 400 C using an ALD process technology. One or more dopants are added to the molybdenum oxide which alter the work function and/or the resistivity. Examples of suitable dopants comprise aluminum, antimony, arsenic, bismuth, niobium, nitrogen, phosphorous, tantalum, vanadium, chlorine, fluorine, or combinations thereof. In one example, the molybdenum oxide is formed at a thickness of about 17 nm and is doped with about 1 angstrom (1 ALD cycle) of aluminum. Optionally, the substrate with the first electrode material is then annealed in an inert or reducing atmosphere comprising between about 1% and about 10% $H_2$ in $N_2$ or other inert gases and advantageously between about 5% and about 10% $H_2$ in $N_2$ or other inert gases between about 300 C and about 650 C for between about 1 millisecond and about 60 minutes.

In the next step, dielectric material, 714, would then be formed above the first electrode structure, 710 and 712. A wide variety of dielectric materials have been targeted for use in DRAM capacitors. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. These dielectric materials may be formed as a single layer or may be formed as a hybrid or nanolaminate structure. In some embodiments of the present invention, the dielectric material is titanium oxide. Typically, dielectric material, 714, is subjected to a PDA treatment before the formation of the second electrode material as mentioned earlier.

In a specific example, the dielectric material comprises between about 6 nm to about 10 nm of titanium oxide wherein at least 30% of the titanium oxide is present in the rutile phase after an anneal treatment. Generally, the titanium oxide dielectric material may either be a single film or may comprise a nanolaminate. Advantageously, the titanium oxide material is doped with aluminum at a concentration between about 5 atomic % and about 15 atomic % aluminum. The titanium oxide dielectric material is formed at a process temperature between about 200 C and 350 C using an ALD process technology. The substrate with the first electrode structure and dielectric material is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 300 C to about 650 C for between about 1 millisecond to about 60 minutes.

In the next step, the second electrode structure is comprised of multiple layers of material. The third material layer, 716, is formed above dielectric material, 714. The third material layer comprises one of metals, conductive metal oxides, conductive metal nitrides, conductive metal silicides, conductive metal carbides, etc. More specifically, in some embodiments, third electrode material, 716, comprises conductive metal compounds of molybdenum oxide. The third material layer additionally comprises one or more dopants added that alter the work function and/or the resistivity of the third material layer. The dopants may be uniformly distributed throughout the third material layer or may be distributed with a gradient in their concentration profile. Fourth material layer, 718, is formed above third material layer, 716, and comprises one of metals, conductive metal oxides, conductive metal nitrides, conductive metal silicides, etc. In one example, fourth material layer, 718, comprises titanium nitride. Optionally, the fourth material layer, 718, and be doped as discussed below. The purpose of this layer is to provide high conductivity to the second electrode structure. In some embodiments of the present invention, the fourth material layer is a metal or a conductive metal nitride.

Dopants may be added to the second electrode structure materials to alter properties such as the work function and the resistivity. The dopants may be added to the second electrode structure materials by introducing the dopant species during the formation of the second electrode structure materials. Typically, the second electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. A second class of dopants may be added to the second electrode materials to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. The maximum doping concentration will vary depending on the dopant material and subsequent anneal conditions. Generally, the doping concentration is chosen such that it does not prevent the second electrode structure materials from crystallizing during the subsequent anneal step. As used herein, the second electrode structure materials will be considered to be crystallized if they are ≥30% crystalline after the anneal as determined by techniques such as x-ray diffraction (XRD). Typically, the capacitor stack would then be subjected to a PMA treatment. The doped second electrode structure may contribute in lowering the leakage current of the capacitor stack.

In one example of the present invention, a fourth electrode material comprising about 50 nm of titanium nitride is formed above a third electrode material comprising between about 5 nm and about 20 nm of molybdenum oxide. These thicknesses are used as examples. Future DRAM devices will require molybdenum oxide thickness of about 2 nm to 3 nm and titanium nitride thicknesses of about 2 nm to 3 nm. The total thickness of the second electrode structure for future DRAM devices will be about 6 nm. The molybdenum oxide electrode material is formed at a process temperature between about 125 C and about 400 C using an ALD process technology. One or more dopants are added to the molybdenum oxide which alter the work function and/or the resistivity. Examples of suitable dopants comprise aluminum, antimony, arsenic, bismuth, chlorine, fluorine, niobium, nitrogen, phosphorous, tantalum, vanadium, or combinations thereof. In one example, the molybdenum oxide is formed at a thickness of about 17 nm and is doped with about 1 angstrom (1 ALD cycle) of aluminum. Typically, the capacitor stack would then be subjected to a PMA treatment.

Figure 8:
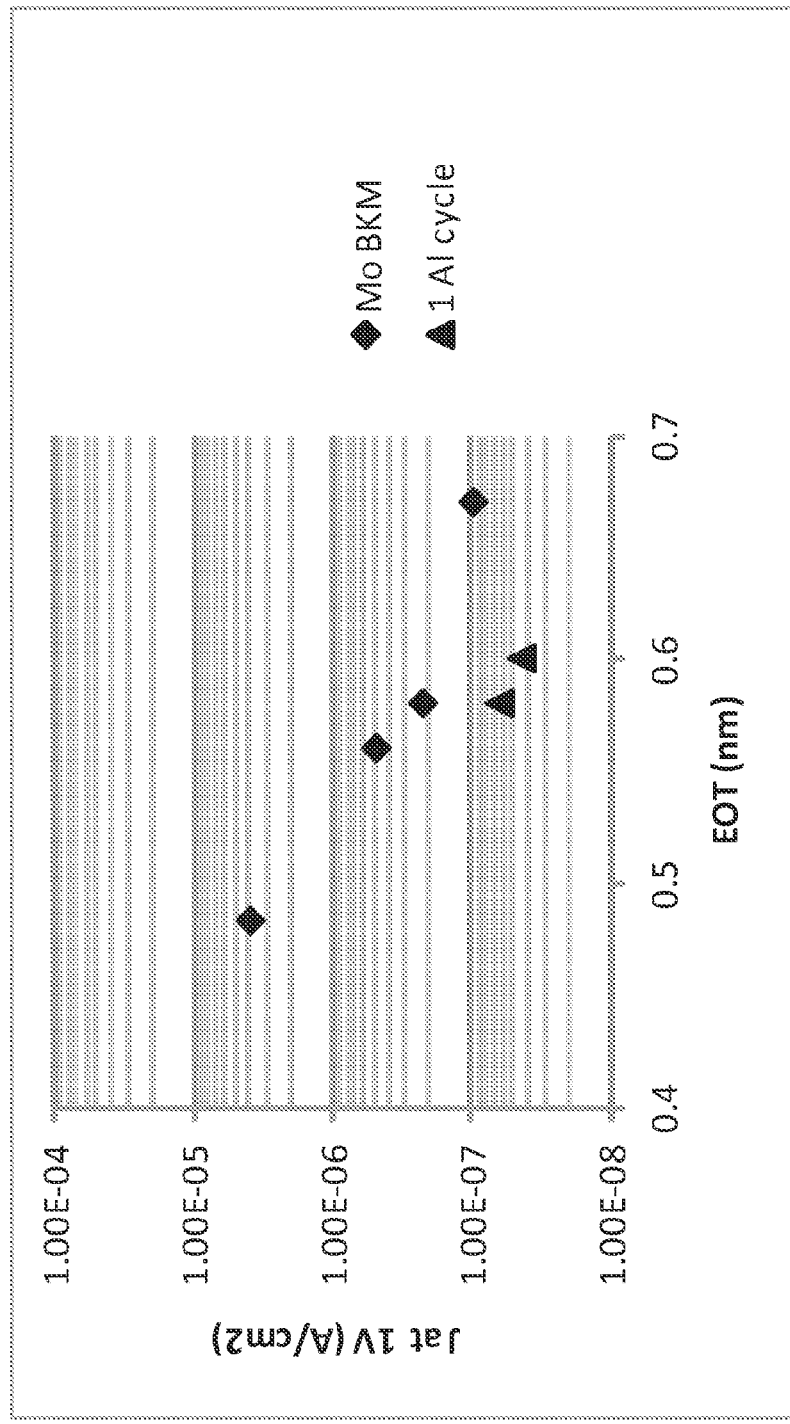
FIG. 8 presents data for leakage current density versus EOT for several non-noble electrode materials.

FIG. 8 presents data that illustrates the benefits of some embodiments of the present invention. Capacitor stacks having the general structure of FIG. 4B were prepared. In each case, a first material layer of the first electrode structure comprised about 50 nm of titanium nitride. The titanium nitride was formed using a PVD technique. In a first case, a second material layer of the first electrode structure comprised about 17 nm of molybdenum oxide. The molybdenum oxide was formed using an ALD technique. In the first case, the molybdenum oxide was formed using process parameters that were optimum at the time of the experiment and the data are labeled "Mo BKM" in FIG. 8. In a second case, the molybdenum oxide was formed using the same process parameters as used in the first case, except that a single ALD cycle of aluminum (i.e. aluminum oxide after the subsequent oxidant pulse) was included in the middle of the formation of the molybdenum oxide and the data are labeled "1 Al cycle" in FIG. 8.

In each case, the dielectric material comprised about 7.9 nm of titanium oxide doped with 10% of Al. The first electrode structure and the dielectric material received a PDA anneal treatment after the formation of the dielectric material. The PDA treatment comprised a 480 C anneal in dilute oxygen for 10 minutes. The second electrode material comprised about 50 nm or less of Pt or Ru. The second electrode was formed using a PVD technique. The capacitor stack then received a PMA anneal treatment at about 460 C in nitrogen for about 10 minutes.

The data presented in FIG. 8 clearly indicates that the addition of a single ALD cycle of aluminum (i.e. aluminum oxide after the subsequent oxidant pulse) decreases the leakage current of the capacitor. Without being bound by theory, it is thought that the presence of the aluminum scavenges excess oxygen in the molybdenum oxide and enables the composition to be closer toward the desired, conductive, $MoO_2$ and away from the undesired, insulating $MoO_3$ compound.

Figure 9:
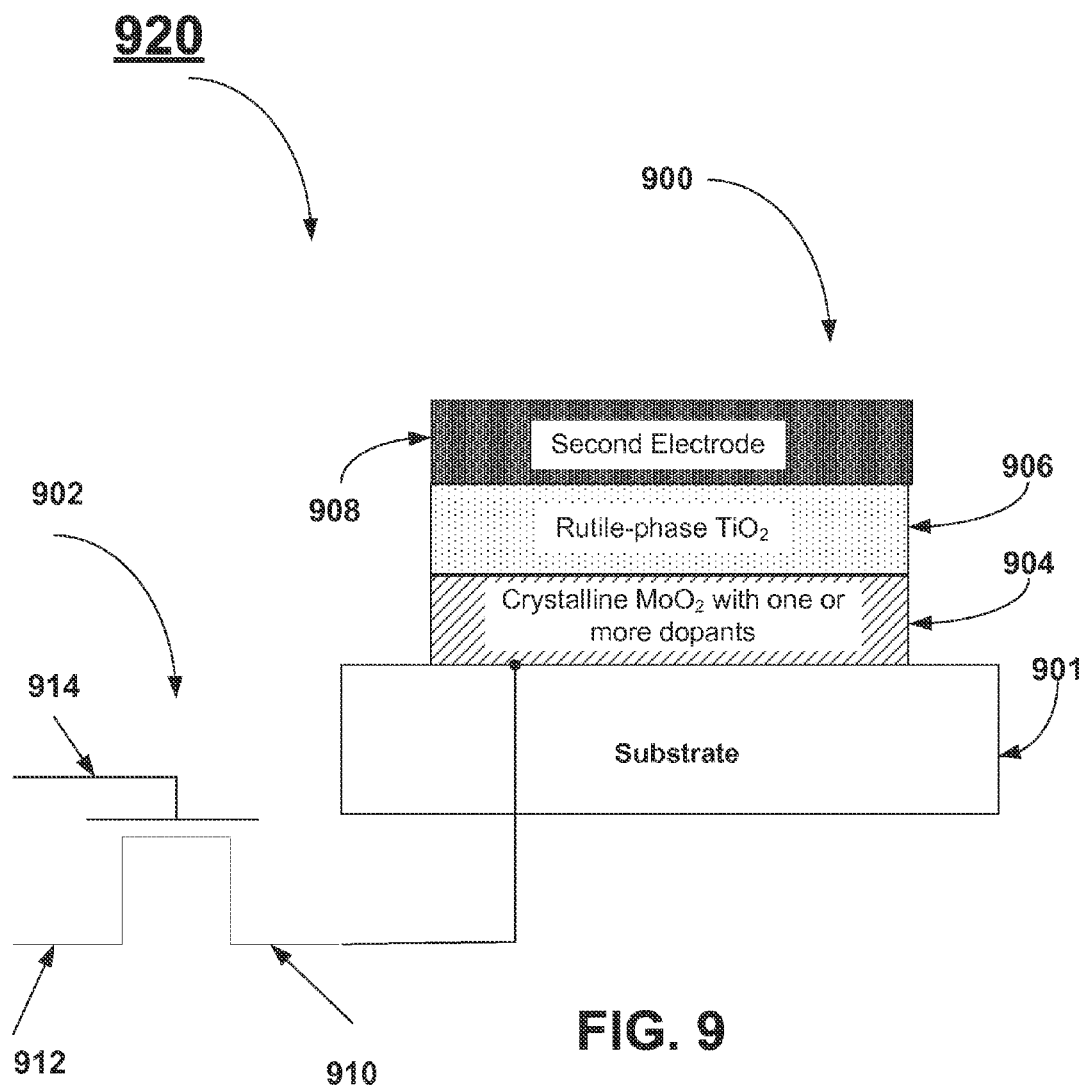
FIG. 9 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 9 is used to illustrate one DRAM cell, 920, manufactured using a doped first electrode structure as discussed previously. The cell, 920, is illustrated schematically to include two principle components, a cell capacitor, 900, and a cell transistor, 902. The cell transistor is usually constituted by a MOS transistor having a gate, 914, source, 910, and drain, 912. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 4A, the cell capacitor, 900, comprises a first electrode, 904, formed on substrate, 901. The first electrode, 904, is connected to the source or drain of the cell transistor, 902. For illustrative purposes, the first electrode has been connected to the source, 910, in this example. For the purposes of illustration, first electrode material, 904, will be crystalline $MoO_2$ doped with one or more dopants in this example as described previously. Examples of suitable dopants comprise aluminum, antimony, arsenic, bismuth, niobium, nitrogen, phosphorous, tantalum, vanadium, chlorine, fluorine, or combinations thereof. The dopants may be uniformly distributed throughout the first electrode material or may be distributed with a gradient in their concentration profile. The doped first electrode material may contribute in lowering the leakage current of the capacitor stack. As discussed previously, first electrode material, 904, may be subjected to an anneal in an inert or reducing atmosphere before the formation of the dielectric material to crystallize the $MoO_2$ and to reduce any $MoO_{2+x}$ compounds that may have formed during the formation of the first electrode material. Dielectric material, 906, is formed above the first electrode material. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. For the purposes of illustration, dielectric material, 906, will be rutile-phase $TiO_2$. As discussed previously, the $TiO_2$ may be doped. Typically, the dielectric material is then subjected to a PDA treatment. The second electrode material, 908, is then formed above the dielectric material. For the purposes of illustration, the second electrode material, 908, will be $MoO_2$ in this example. As discussed previously, the second electrode material may also be doped with one or more dopants to alter the work function and/or the resistivity of the second electrode material as described previously. The capacitor stack is then subjected to a PMA treatment. This completes the formation of the capacitor stack.

Figure 10:
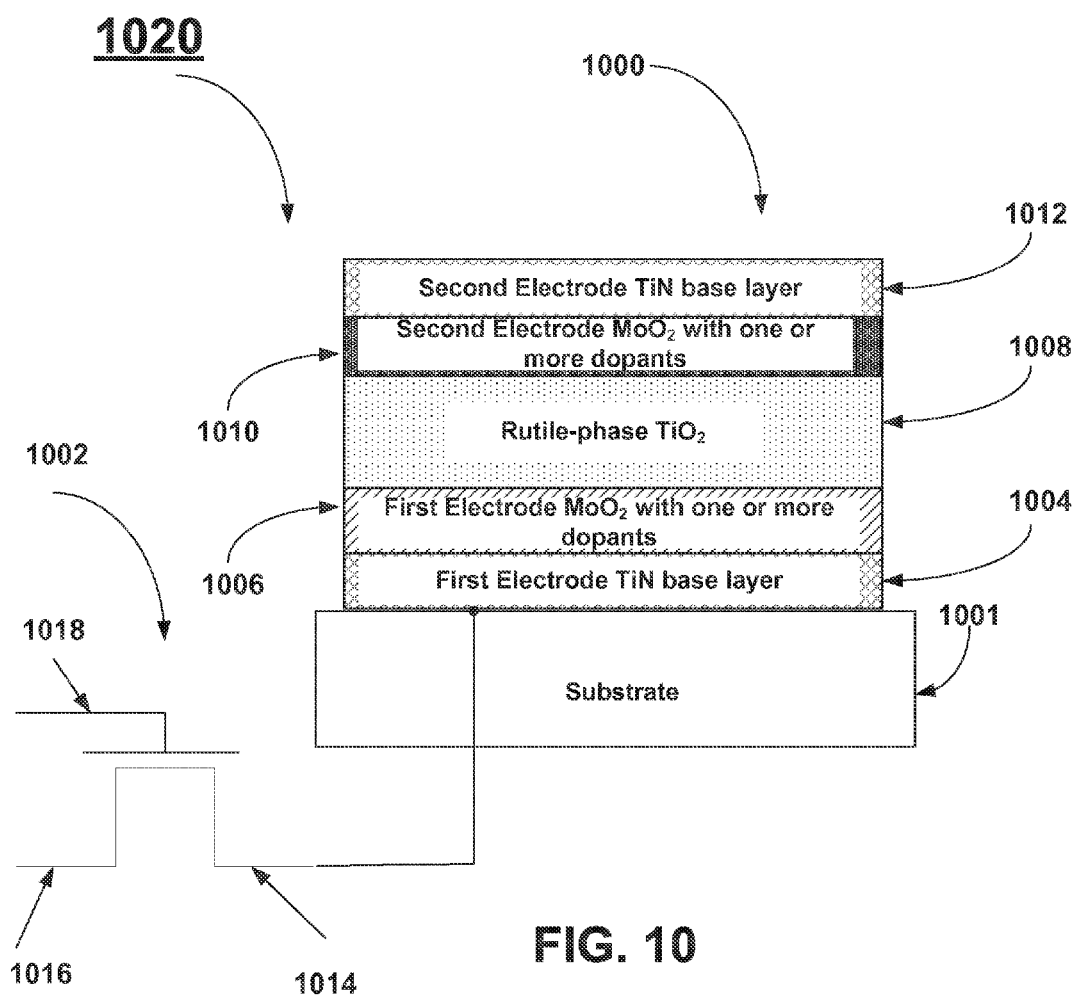
FIG. 10 illustrates a simplified cross-sectional view of a DRAM memory cell fabricated in accordance with some embodiments of the present invention.

FIG. 10 is used to illustrate another DRAM cell, 1020, manufactured using a doped first electrode structure and a doped second electrode structure as discussed previously. In this example, both the first electrode structure and the second electrode structure comprise multiple layers of materials. The cell, 1020, is illustrated schematically to include two principle components, a cell capacitor, 1000, and a cell transistor, 1002. The cell transistor is usually constituted by a MOS transistor having a gate, 1018, source, 1014, and drain, 1016. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 6B, the cell capacitor, 1000, comprises a first electrode structure is comprised of multiple layers of material. First material layer, 1004, is formed on substrate, 1001. The first electrode structure is connected to the source or drain of the cell transistor, 1002. For illustrative purposes, the first electrode structure has been connected to the source, 1014, in this example. First material layer, 1004, comprises one of metals, conductive metal oxides, conductive metal nitrides, conductive metal silicides, etc. Optionally, the first material layer, 1004, can be doped as discussed below. The purpose of this layer is to provide high conductivity to the first electrode structure. In some embodiments of the present invention, the first material is a metal or a conductive metal nitride. As an example, the first material may be titanium nitride. Second material layer, 1006, is formed above the first material layer, 1004. Second material layer, 1006, comprises one of metals, conductive metal oxides, conductive metal nitrides, conductive metal silicides, etc. For the purposes of illustration, second material layer, 1006, will be crystalline $MoO_2$ doped with one or more dopants in this example as described previously. Examples of suitable dopants comprise aluminum, antimony, arsenic, bismuth, niobium, nitrogen, phosphorous, tantalum, vanadium, chlorine, fluorine, or combinations thereof. The second material layer is formed with one or more dopants added that alter the work function and/or the resistivity of the second material layer. The dopants may be uniformly distributed throughout the second material layer or may be distributed with a gradient in their concentration profile as discussed previously. The dopants may be added at a concentration that will not negatively impact the ability of the first electrode structure materials to form the desired crystalline phase to serve as a template for the rutile phase of titanium oxide formed in a subsequent step. The maximum doping concentration will vary depending on the dopant material and subsequent anneal conditions. Generally, the doping concentration is chosen such that it does not prevent the first electrode structure materials from crystallizing during the subsequent anneal step. As used herein, the first electrode structure materials will be considered to be crystallized if they are ≥30% crystalline after the anneal as determined by techniques such as x-ray diffraction (XRD). The doped first electrode structure may contribute in lowering the leakage current of the capacitor stack. As discussed previously, first electrode structure, 1004 and 1006, may be subjected to an anneal in an inert or reducing atmosphere before the formation of the dielectric material to crystallize the $MoO_2$ and to reduce any $MoO_2$, compounds that may have formed during the formation of the first electrode material.

Dielectric material, 1008, is formed above the first electrode structure. Examples of suitable dielectric materials comprise aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc. or doped versions of the same. For the purposes of illustration, dielectric material, 1008, will be rutile-phase $TiO_2$. As discussed previously, the $TiO_2$ may be doped. Typically, the dielectric material is then subjected to a PDA treatment.

In the next step, the second electrode structure is comprised of multiple layers of material. The third material layer, 1010, is formed above dielectric material, 1008. The third material layer comprises one of metals, conductive metal oxides, conductive metal nitrides, conductive metal silicides, conductive metal carbides, etc. For the purposes of illustration, third material layer, 1010, will be crystalline $MoO_2$ doped with one or more dopants in this example as described previously. Examples of suitable dopants comprise aluminum, antimony, arsenic, bismuth, niobium, nitrogen, phosphorous, tantalum, vanadium, chlorine, fluorine, or combinations thereof. The dopants may be uniformly distributed throughout the third material layer or may be distributed with a gradient in their concentration profile. Fourth material layer, 1012, is formed above third material layer, 1010, and comprises one of metals, conductive metal oxides, conductive metal nitrides, conductive metal silicides, etc. Optionally, the fourth material layer, 1012, and be doped as discussed below. The purpose of this layer is to provide high conductivity to the second electrode structure. In some embodiments of the present invention, the fourth material layer is a metal or a conductive metal nitride. As an example, fourth material layer, 1012, comprises titanium nitride.

Dopants may be added to the second electrode structure materials to alter properties such as the work function and the resistivity. The dopants may be added to the second electrode structure materials by introducing the dopant species during the formation of the second electrode structure materials. Typically, the second electrode structure materials are formed using ALD or CVD technologies. In these cases, precursors containing the dopant atoms may be introduced during the process sequence of the ALD or CVD deposition step. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. A second class of dopants may be added to the second electrode material to alter the resistivity. The dopants may be metals, metal oxides, metal nitrides, metal silicides, metal carbides, non-metals, halogens, or combinations thereof (i.e. metal-silicon-nitride, or metal-silicon-oxygen-nitride, etc). The metal oxides, metal nitrides, metal silicides, metal carbides, and combinations may be suitable as dopants because many of these compounds are conductive, and as such, may advantageously alter the work function and/or resistivity of the electrode material. The dopants may be added individually or may be added in combination. The dopants may be uniformly distributed throughout the second electrode structure materials or may be distributed with a gradient in their concentration profile. The maximum doping concentration will vary depending on the dopant material and subsequent anneal conditions. Generally, the doping concentration is chosen such that it does not prevent the second electrode structure materials from crystallizing during the subsequent anneal step. As used herein, the second electrode structure materials will be considered to be crystallized if they are ≥30% crystalline after the anneal as determined by techniques such as x-ray diffraction (XRD). Typically, the capacitor stack would then be subjected to a PMA treatment. The doped second electrode material may contribute in lowering the leakage current of the capacitor stack.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A semiconductor layer stack comprising:
a first electrode structure formed above a substrate;
a dielectric material formed above the first electrode structure; and
a second electrode structure formed above the dielectric material;
wherein the first electrode structure comprises a first dopant,
wherein the first electrode structure comprises a surface serving as a template for forming a rutile phase of the dielectric material,
wherein a concentration of the first dopant has a gradient throughout a thickness of the first electrode structure,
wherein the second electrode structure exhibits ≥30% crystallinity after annealing of the second electrode structure, and
wherein the first dopant comprises at least one of a Group-5 element, a Group-13 element, a Group-15 element, a Group-17 element, or combinations thereof.

2. The semiconductor layer stack of claim 1 wherein the first dopant comprises at least one of aluminum, antimony, arsenic, bismuth, niobium, nitrogen, phosphorous, tantalum, vanadium, chlorine, or fluorine.

3. The semiconductor layer stack of claim 1 wherein the first electrode structure comprises one of metals, conductive metal oxides, conductive metal nitrides, or conductive metal silicides.

4. The semiconductor layer stack of claim 3, wherein the first electrode structure comprises molybdenum oxide.

5. The semiconductor layer stack of claim 4 wherein the first dopant comprises aluminum.

6. The semiconductor layer stack of claim 1, wherein the first electrode structure exhibits ≥30% crystallinity.

7. The semiconductor layer stack of claim 1, wherein the first electrode structure comprises a first material layer and a second material layer, the first material layer comprising titanium nitride, the second material layer comprising molybdenum oxide.

8. The semiconductor layer stack of claim 7, wherein the second material layer comprises a second dopant.

9. The semiconductor layer stack of claim 1 wherein the dielectric material comprises titanium oxide.

10. The semiconductor layer stack of claim 1 wherein the second electrode structure comprises one of metals, conductive metal oxides, conductive metal nitrides, or conductive metal silicides.

11. The semiconductor layer stack of claim 1 wherein the second electrode structure comprises a third material layer and a fourth material layer, the third material layer comprising molybdenum oxide and aluminum as a dopant, the fourth material layer comprising titanium nitride.

12. The semiconductor layer stack of claim 4, wherein the first dopant comprises one of antimony, arsenic, bismuth, niobium, phosphorous, tantalum, vanadium, or combinations thereof.

13. The semiconductor layer stack of claim 4, wherein the first dopant comprises one of fluorine or chlorine.

14. The semiconductor layer stack of claim 4, wherein the first dopant comprises one of nitrogen, phosphorous, or arsenic.

15. The semiconductor layer stack of claim 1, wherein the first electrode structure comprises tin oxide.

16. The semiconductor layer stack of claim 1, wherein the first electrode structure has a thickness of between about 3 nm and 15 nm.

17. The semiconductor layer stack of claim 1, wherein the dielectric materials comprises one of aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions thereof.

18. The semiconductor layer stack of claim 8, wherein the first dopant and the second dopant are the same.

19. The semiconductor layer stack of claim 1, wherein the concentration of the first dopant in the first electrode structure decreases towards an interface with the dielectric material.

20. The semiconductor layer stack of claim 1, wherein the concentration of the first dopant in the first electrode structure is the lowest at an interface of the first electrode.

\* \* \* \* \*